(12) United States Patent
Ishiguro et al.

(10) Patent No.: US 11,107,694 B2
(45) Date of Patent: Aug. 31, 2021

(54) METHOD FOR RELEASING SAMPLE AND PLASMA PROCESSING APPARATUS USING SAME

(71) Applicant: Hitachi High-Technologies Corporation, Tokyo (JP)

(72) Inventors: Masaki Ishiguro, Tokyo (JP); Masahiro Sumiya, Tokyo (JP); Shigeru Shirayone, Tokyo (JP); Tomoyuki Tamura, Tokyo (JP); Kazuyuki Ikenaga, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/660,938

(22) Filed: Oct. 23, 2019

(65) Prior Publication Data
US 2020/0058511 A1 Feb. 20, 2020

Related U.S. Application Data

(63) Continuation of application No. 15/248,205, filed on Aug. 26, 2016, now Pat. No. 10,490,412.

(30) Foreign Application Priority Data

Jan. 4, 2016 (JP) .............................. 2016-000029

(51) Int. Cl.
*H01L 21/3065* (2006.01)
*H01L 21/67* (2006.01)
(Continued)

(52) U.S. Cl.
CPC .... *H01L 21/3065* (2013.01); *H01J 37/32706* (2013.01); *H01J 37/32715* (2013.01);
(Continued)

(58) Field of Classification Search
None
See application file for complete search history.

(56) References Cited

U.S. PATENT DOCUMENTS 5,459,632 A 10/1995 Birang
6,125,025 A * 9/2000 Howald .............. H01L 21/6833
361/234
(Continued)

FOREIGN PATENT DOCUMENTS

JP 11-297803 A 10/1999
JP 2004-047511 A 2/2004
(Continued)

OTHER PUBLICATIONS

Korean Office Action received in corresponding Korean Application No. 10-2016-0098402 dated Jul. 31, 2017.
English Machine Translation JP2010040822, Furuya (Year: 2010).

*Primary Examiner* — Shamim Ahmed
(74) *Attorney, Agent, or Firm* — Mattingly & Malur, PC

(57) ABSTRACT

A sample releasing method for releasing a sample subjected to plasma processing from a sample stage on which the sample is electrostatically attracted by applying DC voltage to an electrostatic chuck electrode, and the method includes: moving the sample subjected to the plasma processing upward above the sample stage; and after moving the sample, controlling the DC voltage such that an electric potential of the sample is to be smaller.

1 Claim, 11 Drawing Sheets

(51) Int. Cl.
*H01J 37/32* (2006.01)
*H01L 21/683* (2006.01)
(52) U.S. Cl.
CPC .. *H01J 37/32788* (2013.01); *H01L 21/67069* (2013.01); *H01L 21/6833* (2013.01)

(56) References Cited

U.S. PATENT DOCUMENTS

| | | | |
|---|---|---|---|
| 6,628,500 B1* | 9/2003 | Thomas | H01L 21/6833 |
| | | | 361/234 |
| 6,898,064 B1 | 5/2005 | Berman | |
| 2005/0000654 A1* | 1/2005 | Morimoto | H01J 37/32082 |
| | | | 156/345.47 |
| 2006/0238953 A1 | 10/2006 | Hanawa | |
| 2008/0242086 A1 | 10/2008 | Matsumaru | |
| 2009/0097185 A1* | 4/2009 | Shannon | H02N 13/00 |
| | | | 361/234 |
| 2010/0271744 A1* | 10/2010 | Ni | H01L 21/6833 |
| | | | 361/233 |
| 2012/0070996 A1 | 3/2012 | Hao | |
| 2015/0194330 A1 | 7/2015 | Sasaki et al. | |
| 2015/0303092 A1* | 10/2015 | Kawabata | H02N 13/00 |
| | | | 361/234 |

FOREIGN PATENT DOCUMENTS

| | | |
|---|---|---|
| JP | 2010-040822 A | 2/2010 |
| KR | 1998-024679 U | 7/1998 |
| KR | 10-2015-0053899 A | 5/2015 |

* cited by examiner

METHOD FOR RELEASING SAMPLE AND PLASMA PROCESSING APPARATUS USING SAME

BACKGROUND OF THE INVENTION

The present invention relates to a technique of manufacturing a semiconductor device. In particular, the present invention relates to a sample releasing method and a plasma processing apparatus suitable for manufacturing the semiconductor device.

Plasma etching is known as one of a plasma processing method in manufacturing the semiconductor device. In the plasma etching, a sample substrate (wafer) is arranged on a sample stage in a processing chamber and is exposed to plasma. At this time, a specific laminated film is selectively removed on the wafer by adjusting various processing conditions such as a kind of gas introduced into the processing chamber, and radio frequency power applied to the wafer, and a fine circuit pattern is formed on the wafer.

In the plasma etching described above, the wafer is generally fixed onto the sample stage by using an electrostatic chuck electrode because of a demand for preventing a positional deviation of the wafer in processing or adjusting temperature of the wafer. After the processing, fixing of the wafer is cancelled, and the wafer is released from the sample stage by using releasing mechanism which pushes up the wafer toward above the sample stage, and then the wafer is conveyed from the processing chamber.

In chucking of the wafer by using the electrostatic chuck electrode, the wafer is attracted by electrostatic force generated in dielectric film arranged between an electrode and the wafer by applying voltage to the electrode. Accordingly, the chucking is cancelled by interrupting the voltage applied to the electrode, however electric charge is remained due to a lack of destaticization to the dielectric film or the wafer, and therefore the attraction force to the wafer may be maintained after interrupting the voltage to the electrode.

When the remaining attraction force is generated, the positional deviation of the wafer in releasing the wafer from the sample stage might be occurred, or the wafer might be fractured due to force applied to the wafer in releasing. The positional deviation of the wafer leads a device error in conveying of the wafer, and as a result, product processing might be stopped. The fracture of the wafer leads not only a loss of the wafer but also a loss of time for recovering of the device to remove the fractured wafer from the device. In each case, a product throughput might be deteriorated, and therefore it is necessary to reduce the remaining attraction force by means of the destaticization in order to reduce a chance of occurrence of the problem described above. The following method is known as a destaticization method to reduce the attraction force.

In JP-A-2010-040822, a destaticization method including a step of applying a chuck voltage to an electrostatic chuck electrode in an electrostatic chuck device and electrostatically attracting a processed substrate to the electrostatic chuck electrode, a step of processing the processed substrate in a state in which the processed substrate is electrostatically attracted to the electrostatic chuck electrode, a vacuum processing step of vacuuming a chamber after the step of processing to the processed substrate is finished, a step of stabilizing the voltage of the electrostatic chuck electrode in the same polarity voltage as the chuck voltage during the vacuum processing step, a step of providing a destaticization gas into the chamber after the voltage of the electrostatic chuck electrode is stabilized, a step of changing the destaticization gas, which is provided into the chamber, into plasma, a step of releasing the processed substrate from the electrostatic chuck electrode, and a step of setting the electrostatic chuck electrode to a reference potential after the processed substrate is released from the electrostatic chuck electrode, is disclosed.

Further, in JP-A-2004-047511, a releasing method which releases an attracted object, which is arranged on a dielectric body including an electrode therein and is attracted to the dielectric body by means of electrostatic force caused by applying DC voltage having a predetermined polarity to the electrode, from the dielectric body is disclosed. The releasing method includes a destaticization method including a step of stopping the application of the DC voltage to the electrode, a step of exposing the attracted object to plasma for destaticizing, and a voltage applying step in which the DC voltage having the same polarity as a self-bias voltage generated in the attracted object by exposing the attracted object to the plasma is applied to the electrode.

SUMMARY OF THE INVENTION

In JP-A-2010-040822 and JP-A-2004-047511, electric potential, which is generated on a surface of the wafer due to an inflow of charged particles from the plasma used in the destaticization processing, is not taken into consideration. In the plasma etching, high resistance film is arranged on a backside of the wafer to be processed, and therefore it may be deemed that the wafer is substantially insulated from other structures.

In a case in which the wafer is insulated, since the charged particles flowed in from the plasma cannot move, a floating potential of the plasma might be remained on the surface of the wafer after the plasma is dissipated. That potential is remained on the wafer after the plasma discharge is finished until the wafer is conveyed from the processing chamber.

Further, it is known that dust (hereinafter referred to as foreign substance) in a vacuum processing chamber is prevented from adhering to the wafer because a plasma sheath is generated on the wafer in generating the plasma, however after the plasma discharge is finished, a foreign substance adhering prevention effect caused by the plasma sheath is disappeared and therefore the foreign substance is apt to adhere to the wafer.

Further, the electric potential on the wafer may be generated by an unintentional factor such as an area difference, a capacity (resistance), or a change with using an electrode long time.

When the electric potential is generated on the surface of the wafer after the plasma discharge is finished as described above, the charged foreign substance is attracted and adhered to the wafer due to the electric potential, and therefore yield in production might be deteriorated.

The present invention is taking the aforementioned problems into consideration and provides a sample releasing method and a plasma processing apparatus capable of reducing a foreign substance adhered to a sample.

According to an aspect of the present invention, there is provided a sample releasing method for releasing a sample subjected to plasma processing from a sample stage on which the sample is electrostatically attracted by applying DC voltage to an electrostatic chuck electrode, the method including: moving the sample subjected to the plasma processing upward above the sample stage; and after moving the sample, controlling the DC voltage such that an electric potential of the sample is to be smaller.

Furthermore, according to an aspect of the present invention, there is provided a sample releasing method for releasing a sample subjected to plasma processing from a sample stage on which the sample is electrostatically attracted by applying DC voltage to an electrostatic chuck electrode, the method including: turning off plasma for releasing the electrostatically attracted sample from the sample stage; and after turning off the plasma, changing the DC voltage toward a positive direction compared to the DC voltage before turning off the plasma.

Furthermore, according to an aspect of the present invention, there is provided a plasma processing apparatus including: a processing chamber in which a sample is processed by using plasma; a radio frequency power source which provides radio frequency power to generate the plasma; a sample stage on which the sample is arranged, the sample stage having an electrode to electrostatically attract the sample; a DC power source which applies DC voltage to the electrode; and a control device which controls an output value of the DC power source after the sample subjected to the plasma processing is moved upward above the sample stage such that an electric potential of the sample is to be smaller.

Furthermore, according to an aspect of the present invention, there is provided a plasma processing apparatus including: a processing chamber in which a sample is processed by using plasma; a radio frequency power source which provides radio frequency power to generate the plasma; a sample stage on which the sample is arranged, the sample stage having an electrode to electrostatically attract the sample; a DC power source which applies DC voltage to the electrode; and a control device which controls an output value of the DC power source after the plasma for releasing the electrostatically attracted sample from the sample stage is turned off such that the DC voltage is changed toward a positive direction compared to the DC voltage before the plasma is turned off.

According to the present invention, a foreign substance adhered to a sample can be reduced.

DESCRIPTION OF THE EMBODIMENTS

Hereinafter, each embodiment according to the present invention is described.

Example 1

Figure 1:
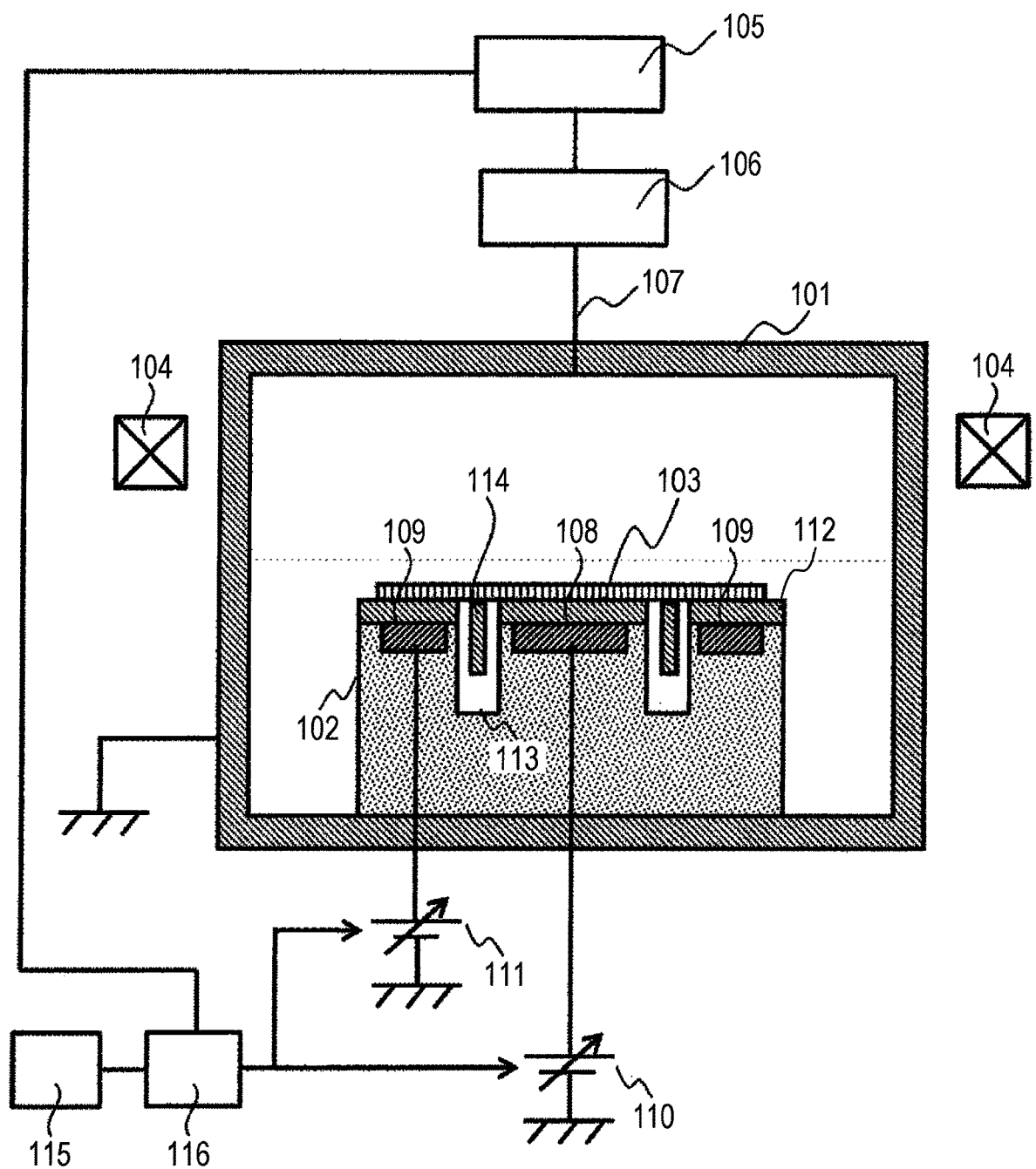
FIG. 1 is a diagram illustrating a configuration of a plasma processing apparatus in which a main part is illustrated by a cross section according to the present invention.

A sample releasing method according to a first embodiment of the present invention is described with reference to FIGS. 1 to 10. FIG. 1 is a diagram illustrating a configuration of a plasma processing apparatus in which a main part is illustrated by a cross section according to the first embodiment. The plasma processing apparatus according to the first embodiment shown in FIG. 1 is an electron cyclotron resonance (Electron Cyclotron Resonance: ECR) type plasma etching device. Hereinafter, electron cyclotron resonance is described as ECR.

The plasma processing apparatus as the ECR type plasma etching device shown in FIG. 1 performs etching processing of a substrate by arranging a wafer 103 as a semiconductor device to be a sample on a sample stage 102 as a mounting base of the sample inside a processing chamber 101 as a vacuum processing chamber and by generating plasma inside the processing chamber 101.

Inner wall base material of the processing chamber 101 includes a conductive body connected to the ground. In the present embodiment, the inner wall base material including the conductive body connected to the ground may be exposed to the plasma. Further, the conductive inner wall base material may include thin dielectric film which makes an inner wall surface approximately 0 V quickly after the plasma is dissipated.

The plasma processing apparatus has a mechanism, which generates plasma, provided with a solenoid coil 104, a microwave power source 105 as a radio frequency power source, a microwave oscillator 106, and a microwave waveguide 107. A magnetic field is generated in the vacuum processing chamber by the solenoid coil 104. A microwave generated in the microwave oscillator 106 by means of radio frequency power provided from the microwave power source 105 is introduced to the processing chamber 101 via waveguide 107. The microwave gives energy to an electron by ECR in the magnetic field generated by the solenoid coil 104. The electron generates the plasma by ionizing gas provided from a gas providing source not shown.

During the plasma processing, cooling gas for adjusting a temperature of the wafer 103 is provided to a backside of the wafer 103. In order to prevent the positional deviation of the wafer 103 due to the cooling gas, the wafer 103 is attracted onto the sample stage 102 by bipolar type (dipole) electrostatic chuck electrodes 108, 109. The electrostatic chuck electrodes 108, 109 are coaxially arranged such that one electrostatic chuck electrode 108 is arranged at an inner side and another electrostatic chuck electrode 109 is arranged at an outer side.

Variable DC power sources 110, 111, which are mutually independent power sources, are respectively connected to the electrostatic chuck electrodes 108, 109. One variable DC power source 110 is connected to the inside electrostatic chuck electrode 108, and another variable DC power source 111 is connected to the outside electrostatic chuck electrode 109. A dielectric layer 112 is arranged between the electrostatic chuck electrodes 108, 109 and the wafer 103. The electrostatic chuck electrodes 108, 109 and the wafer 103 are electrically connected with a limited resistance and a limited electrostatic capacity.

Voltages with mutually opposite polarities are applied to the electrostatic chuck electrodes 108, 109 respectively from the respective power sources in attracting the wafer. For example, a voltage of +500 volts is applied to the inside electrostatic chuck electrode 108 from the variable DC power source 110, and a voltage of −500 volts is applied to the outside electrostatic chuck electrode 109 from the variable DC power source 111.

On the other hand, voltages of mutually same polarity may be applied to the electrostatic chuck electrodes 108, 109 from the respective power sources when the attraction is not performed. By applying the voltages of the same polarity as described above, the electric potential of the wafer can be controlled without performing the attraction when the plasma discharge is not performed. For example, the electric potential of the wafer can be set to a positive polarity by applying a voltage of +500 volts to the inside electrostatic chuck electrode 108 from the variable DC power source 110 and applying a voltage of +500 volts to the outside electrostatic chuck electrode 109 from the variable DC power source 111.

The plasma processing apparatus has a mechanism, which releases the wafer from the sample stage 102 after the processing is finished and the attraction is cancelled, provided with a through hole 113 formed inside the sample stage and a vertically movable push up pin 114 arranged in the through hole 113. After cancelling the electrostatic chuck, by moving the wafer upward above the sample stage 102 by the push up pin 114 as a releasing mechanism, the wafer is released from the sample stage 102, and then the wafer on the push up pin moved upward is conveyed to the outside of the processing chamber by using a conveyance mechanism.

Further, the plasma processing apparatus according to the present example has a storage device 115 and a control device 116 for controlling output voltage values of the variable DC power sources 110, 111. The variable DC power sources 110, 111 are connected to the control device 116, and their output voltage values are controlled by the control device 116. Further, the control device 116 is formed to control the microwave power source 105, the solenoid coil 104, pressure inside the processing chamber 101 and the like in the plasma processing apparatus.

Figure 2:
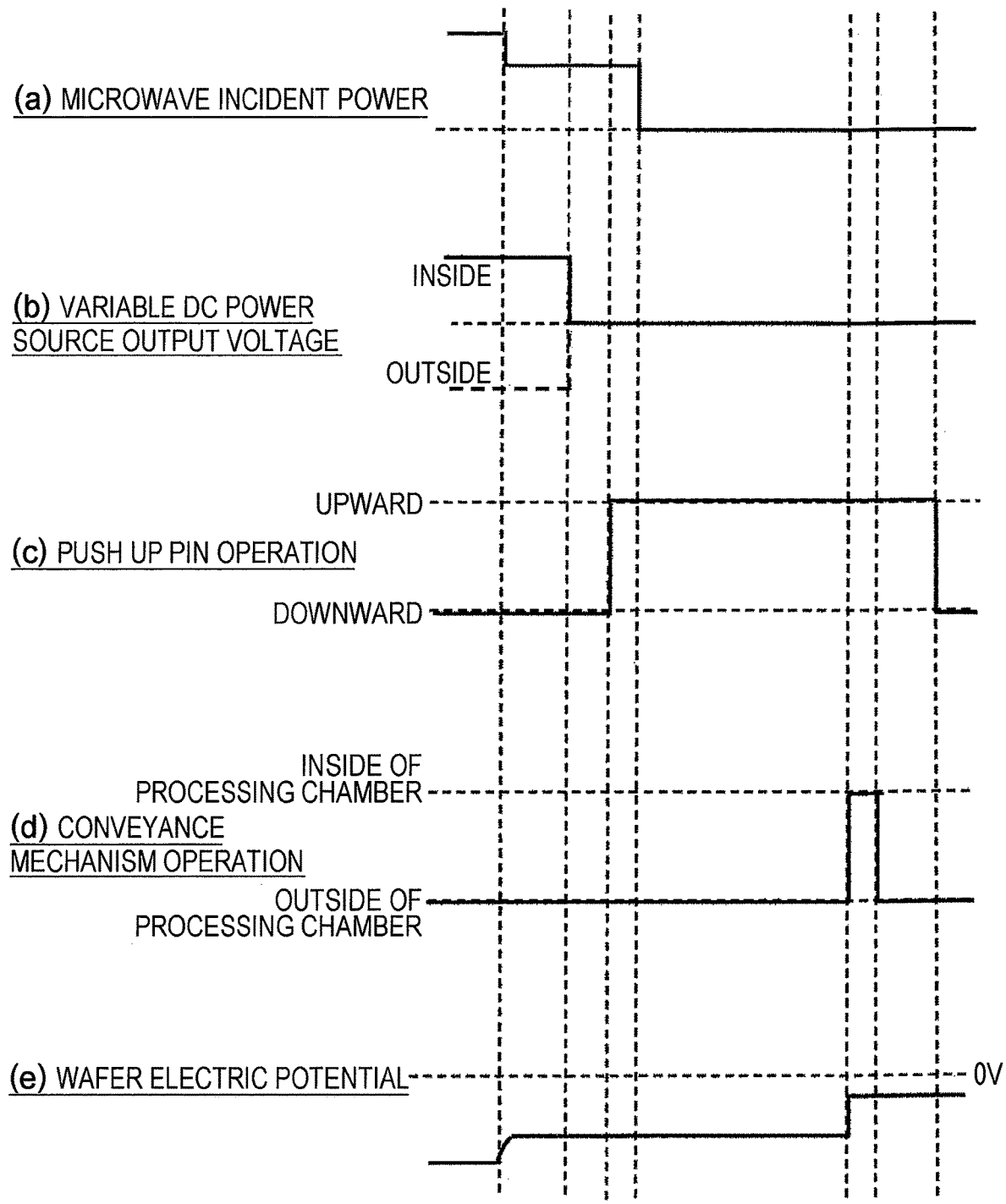
FIG. 2 is a time chart illustrating conventional destaticization processing.

Next, operation of conventional destaticization processing and a problem thereof are described with reference to a time chart of the destaticization processing in a conventional processing method shown in FIG. 2. In FIG. 2, incident power of the microwave is shown in (a), output voltage of the variable DC power source is shown in (b), operation of the push up pin is shown in (c), operation of the conveyance mechanism is shown in (d), and the electric potential of the wafer is shown in (e).

After the etching processing, the microwave incident power is changed, and plasma for the destaticization is generated. After the microwave incident power is the change, the microwave incident power is, for example 400 W. At this time, although an illustration is omitted, it is preferable that gas for generating the plasma for the destaticization is switched at the same time. Inactive gas is suitable to the plasma for the destaticization, and Ar, He or the like is generally used. Here, the destaticization denotes processing to release the wafer 103 electrostatically attracted on the sample stage 102 from the sample stage 102 by using the plasma.

And then, after the processing by means of the plasma for the destaticization is performed for several seconds, the voltages applied to the electrostatic chuck electrodes 108, 109 are set to 0 volt by using the variable DC power source 110, 111 while keeping the plasma discharge. And then, after the destaticization plasma processing is performed for further several seconds, the wafer is released from the sample stage 102 by the push up pin 114 while keeping the plasma discharge.

And then, after the destaticization plasma processing is performed for further several seconds, the microwave incident power is interrupted and the plasma processing is finished. After the plasma processing is finished, the wafer on the push up pin moved upward is conveyed to the outside of the processing chamber by means of the conveyance mechanism, and after the wafer is conveyed, the push up pin is moved downward.

With the aforementioned processing, the electric potential, which is such a degree of a plasma floating potential, is generated on the wafer by the destaticization plasma processing, and the electric potential is remained on the wafer after plasma discharge is finished and the electric potential attracts the foreign substance to the wafer until the wafer is conveyed. Accordingly, it is preferable that the electric potential of the wafer is suppressed after the push up pin is moved upward and the plasma processing is finished.

Figure 3:
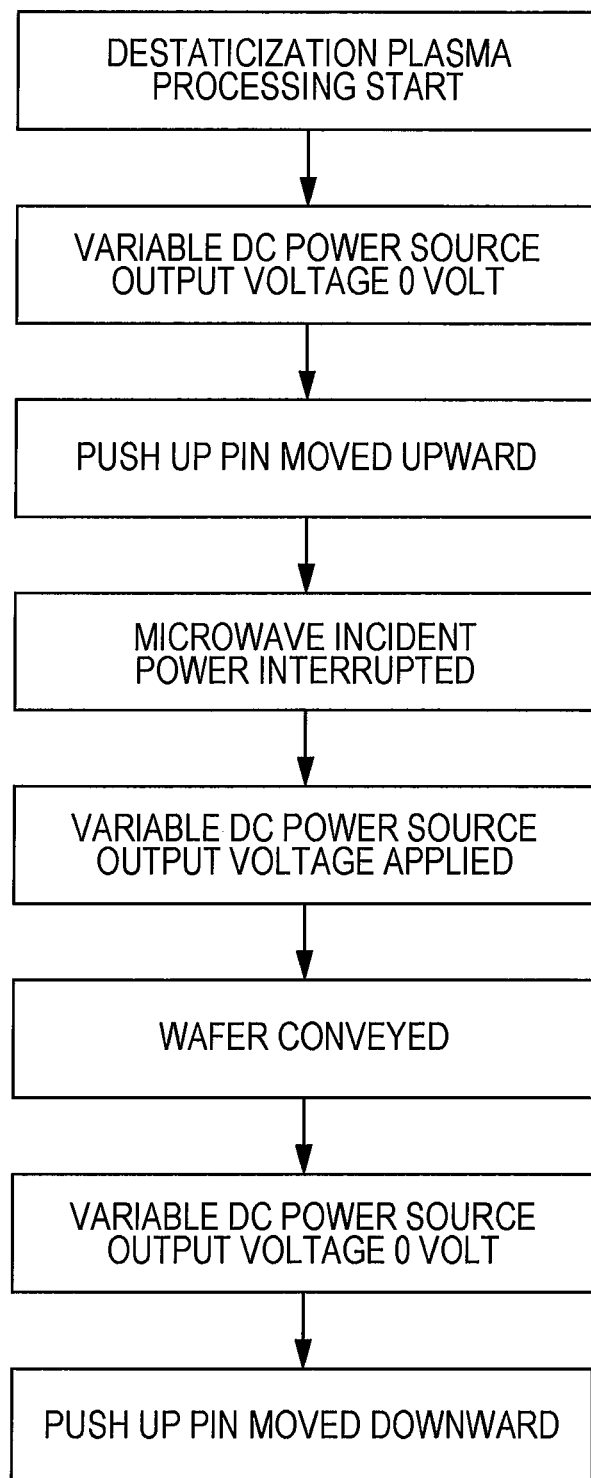
FIG. 3 is a flow chart according to the present invention.

A flow chart of processing according to the present example to solve the aforementioned problem is shown in FIG. 3. In the present example, similar to the operation of the conventional one, the destaticization plasma processing is started at first. And then, the applied voltage to the electrostatic chuck electrode is set to 0 volt, and the push up pin is moved upward, and the microwave incident power is interrupted. After that, in the present example, the voltages with the same polarities are applied to the electrostatic chuck electrodes 108, 109 by using the variable DC power sources 110, 111. After that, the wafer is conveyed while keeping the voltage applied to the electrostatic chuck electrode, and after the wafer is conveyed, the applied voltage to the electrostatic chuck electrode is set to 0 volt. After the applied voltage to the electrostatic chuck electrode is set to 0 volt, the push up pin is moved downward.

Figure 4:
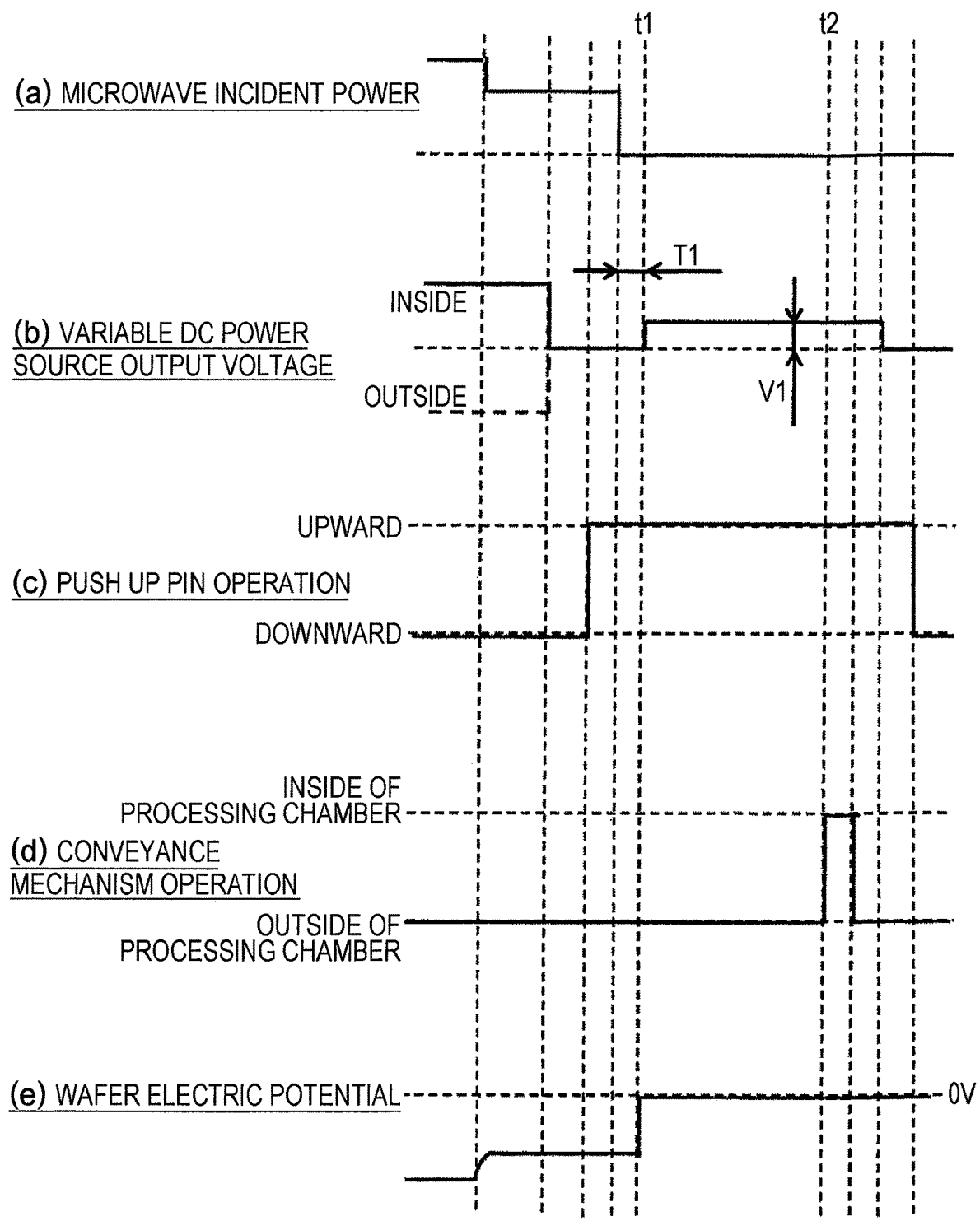
FIG. 4 is a time chart illustrating destaticization processing according to the present invention.

A time chart of the processing according to the present example depending on the flow chart of FIG. 3 is shown in FIG. 4. In the processing according to the example 1, after the microwave incident power is interrupted, by applying a voltage V1 with a positive polarity to both of the electrostatic chuck electrodes 108, 109 by using variable DC power sources 110, 111 at time t1 in which time T1 has passed after the microwave incident power is interrupted, the electric potential of the wafer having a negative electric potential can be controlled to 0 volt.

The time T1 for starting the control and an output voltage value V1 used in the control are stored as values thereof in the storage device 115 shown in FIG. 1. The control device 116 detects the interruption of the microwave incident power from the microwave power source 105 to which the control device 116 is connected, and then, the control device 116 controls the applied voltage to the electrostatic chuck electrode from the DC power source in accordance with the time T1 and V1. At this time, the output voltage of the variable DC power source 110 and the output voltage of the variable DC power source 111 are set to the same value of V1.

The applied voltage V1 is for counteracting the floating potential of the plasma remained on the wafer in order to set the electric potential of the wafer to 0 volt, and therefore information with respect to the floating potential of the plasma is necessary. Further, since the voltage is applied to the electrostatic chuck electrode in a state in which the push up pin is located at an upper position, it is necessary to grasp a relationship between the electric potential of the wafer and the applied voltage to the electrostatic chuck electrode in a state in which the push up pin is located at the upper position.

Further, the time T1 denotes a standby time to wait for dissipation of the charged particles in the plasma after the microwave incident power is interrupted. When the plasma exists, even if the voltage is applied to the electrostatic chuck electrode, since the electric potential of the wafer is affected by inflow of the charged particles from the plasma, the electric potential of the wafer cannot be controlled by applying the voltage to the electrostatic chuck electrode. Accordingly, in order to control the electric potential of the wafer at the time t1, it is necessary to start the application of the voltage to the electrostatic chuck electrode after incidence of the microwave is finished and the plasma is surely dissipated.

After that, the wafer is sent to the conveyance mechanism at time t2. At this time, in a case in which the conveyance mechanism is formed of insulation material, the electric potential affected by the applied voltage of V1 is generated on the wafer in sending the wafer to the conveyance mechanism. The electric potential is undesirable because the electric potential attracts the foreign substance to the wafer in conveying. It is preferable that the conveyance mechanism is formed of conductive material in order to suppress the electric potential in conveying. For example, the conveyance mechanism may be formed of material in which resistance from the wafer on the conveyance mechanism to the ground via the conveyance mechanism is to be less than approximately $10^8$ kΩ.

Figure 5:
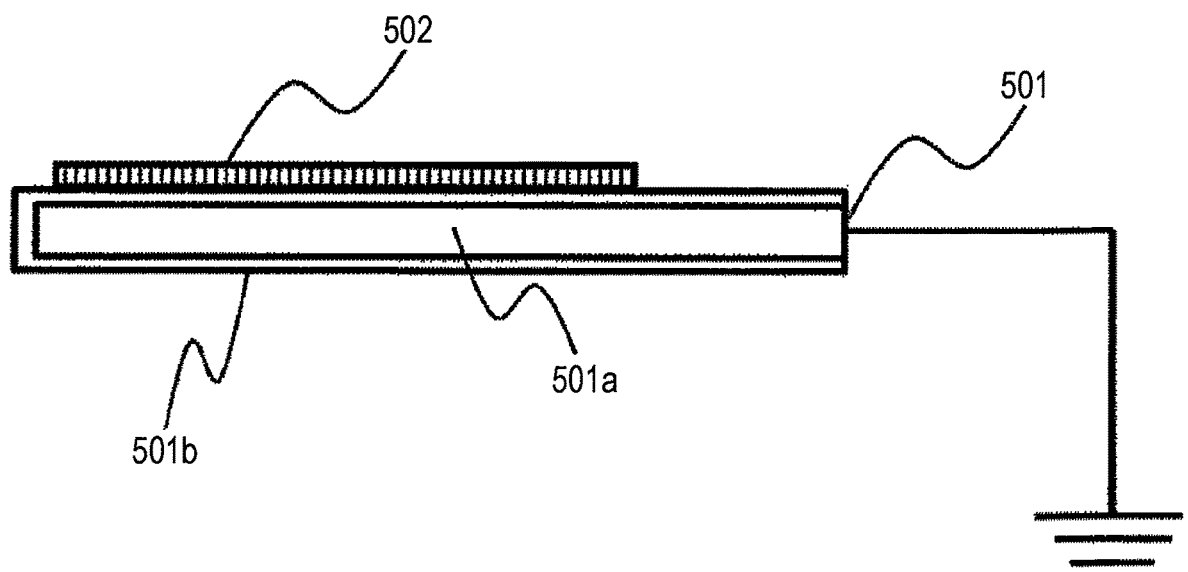
FIG. 5 is a conveyance mechanism having a structure in which an electrostatic capacity of a wafer against the ground is sufficiently large.

A structure in which the electrostatic capacity against the ground from the wafer via the conveyance mechanism is to be sufficiently large may be adopted in order to suppress the electric potential in conveying. FIG. 5 illustrates an example of the conveyance mechanism having a structure in which the electrostatic capacity of the wafer against the ground is sufficiently large. As shown in FIG. 5, the conveyance mechanism for the wafer may have a wafer conveyance arm 501 including a conductive body part 501a which connects the wafer conveyance arm 501 to the ground and a dielectric film 501b which covers the conductive body, and the electrostatic capacity of the wafer 502 on the conveyance arm and the conductive body part 501a of the arm may be set to be more than approximately $10^{-10}$ F.

Hereinafter, determination of the time T1 to start control of the applied voltage to the electrostatic chuck electrode after the application of the voltage V1 to the electrostatic chuck electrode by the DC power source and the incidence of the microwave are finished.

Figure 6:
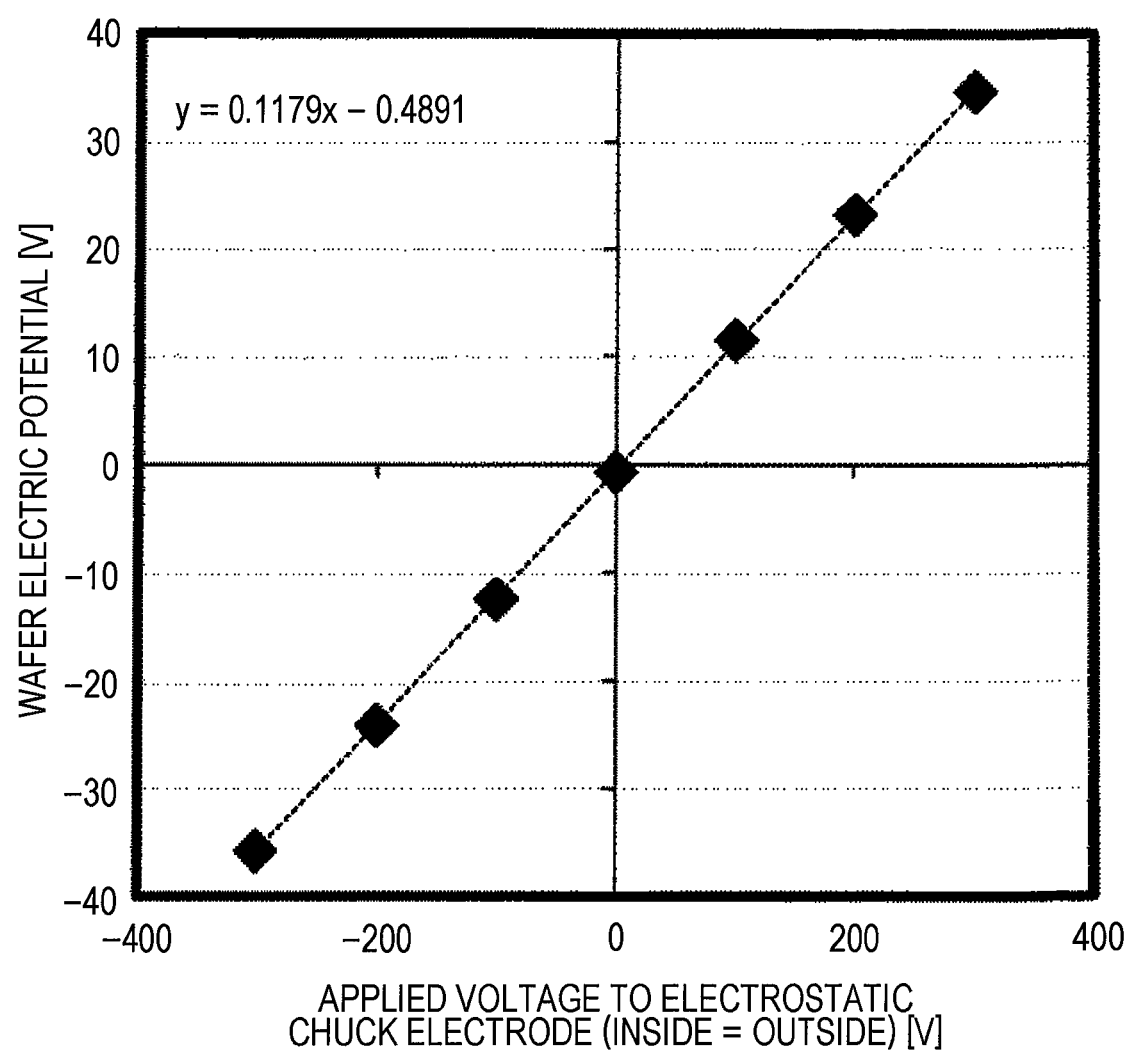
FIG. 6 is a graph illustrating a relationship between an electric potential of the wafer and an applied voltage to an electrostatic chuck electrode after a push up pin is moved upward.

At first, as to the applied voltage V1, a relationship, which is obtained from an experiment, between the electric potential of the wafer after the push up pin is moved upward and the applied voltage to the electrostatic chuck electrode from the DC power source is shown in FIG. 6. Since the electric potential of the wafer is changed by controlling the applied voltage to the electrostatic chuck electrode, it is found that the electric potential of the wafer can be controlled by controlling the voltage applied to the electrostatic chuck electrode in a state in which the push up pin is located at the upper position. Further, it is found that a ratio of the applied voltage to the electrostatic chuck electrode:the electric potential of the wafer is approximately 1:0.118.

Figure 7:
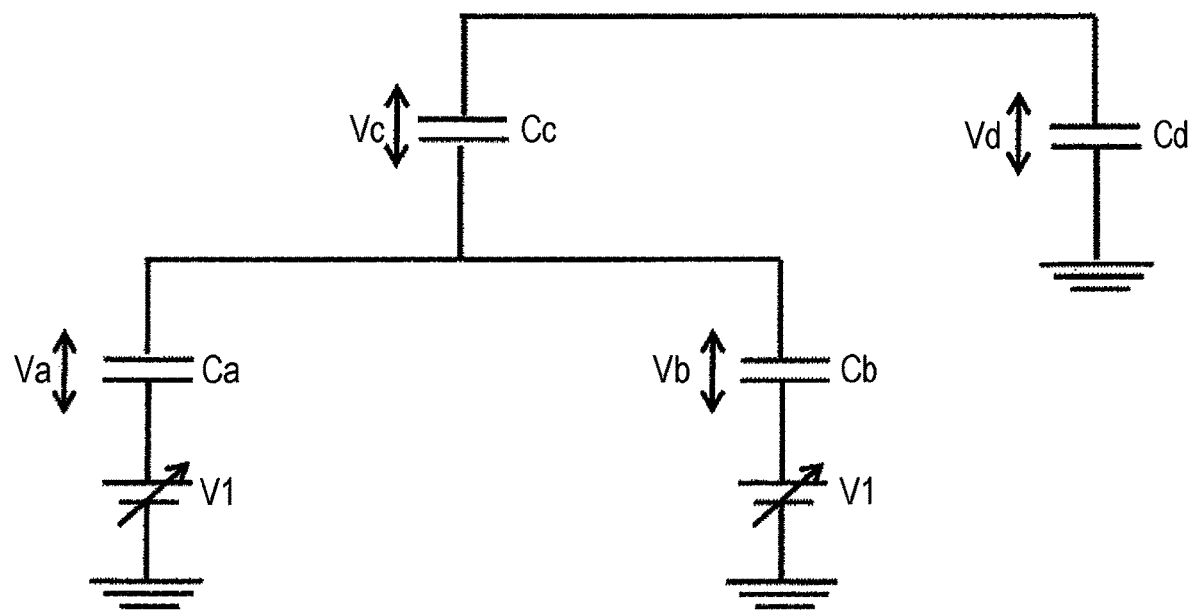
FIG. 7 is a diagram illustrating an equivalent circuit in which a variable DC power source, an electrostatic chuck electrode, a dielectric layer, the wafer and the push up pin are modeled.

It is assumed that the ratio described above is determined by a relationship among the electrostatic capacity of the dielectric layer 112 between the electrostatic chuck electrode and a surface of the sample stage, the electrostatic capacity between the surface of the sample stage and the wafer, and the electrostatic capacity of the wafer against the ground via the push up pin. FIG. 7 illustrates an equivalent circuit in which an electric circuit provided with the electrostatic chuck electrode, the dielectric film, the wafer, and the push up pin is simplified. Here, in the actual equivalent circuit, each component has each resistance, however for the convenience of description, it is described below by only focusing on the electrostatic potential.

Here, Ca and Cb denote an electrostatic capacity value of the dielectric layer. Va and Vb denote a potential difference in the electrostatic capacity of the dielectric layer. Cc denotes the electrostatic capacity value between the surface of the sample stage and the wafer. Vc denotes the potential difference in the electrostatic capacity between the surface of the sample stage and the wafer. Cd denotes the electrostatic capacity value of the wafer against the ground via the push up pin. Vd denotes the potential difference in the electrostatic capacity of the wafer against the ground. Here, V1 denotes the output voltage of the DC power source applied to the inside and the outside electrostatic chuck electrodes. In the equivalent circuit shown in FIG. 7, the following formulas are established.

$$(C_a+C_b)V=C_cV_c=C_dV_d$$

$$V_1=V+V_c+V_d \quad \text{Formula 1}$$

Here, the relationship between V, Va, Vb is V=Va=Vb. And when Ca=Cb>>Cc and Ca=Cb>>Cd, V=Va=Vb~0 is defined and the following formulas are established.

$$C_cV_c=C_dV_d$$

$$V_1=V_c+V_d \quad \text{Formula 2}$$

At this time, the electric potential of the wafer is represented as below.

$$V_{waf} = \frac{C_c}{C_d}V_c \quad \text{Formula 3}$$

Accordingly, it is assumed that a ratio between the applied voltage to the electrostatic chuck electrode and the electric potential of the wafer is mainly determined by the electrostatic capacity between the surface of the sample stage and the wafer and the electrostatic capacity of the wafer against the ground via the push up pin. The electrostatic capacity between the wafer and the surface of the sample stage can be calculated by an area of the wafer and a distance between the wafer and the surface of the sample stage, namely the following formula based on a push up distance of the push up pin.

$$C_c = \varepsilon_0 \frac{S}{d} \quad \text{Formula 4}$$

Here, $\varepsilon_0$ denotes a dielectric constant in vacuum. S denotes an area of the wafer. d denotes the push up distance of the push up pin. While, it is assumed that the electrostatic capacity of the wafer against the ground via the push up pin is mainly determined by a configuration of a device, and the electrostatic capacity may be grasped by using a network analyzer.

In the present example, the relationship between the electric potential of the wafer and the applied voltage to the electrostatic chuck electrode when the wafer is pushed up may be grasped through an experiment shown in FIG. 6, or alternatively may be calculated based on the relationship between the electrostatic capacity between the wafer and the surface of the sample stage when the wafer is pushed up and the electrostatic capacity of the wafer against the ground.

Figure 8A:
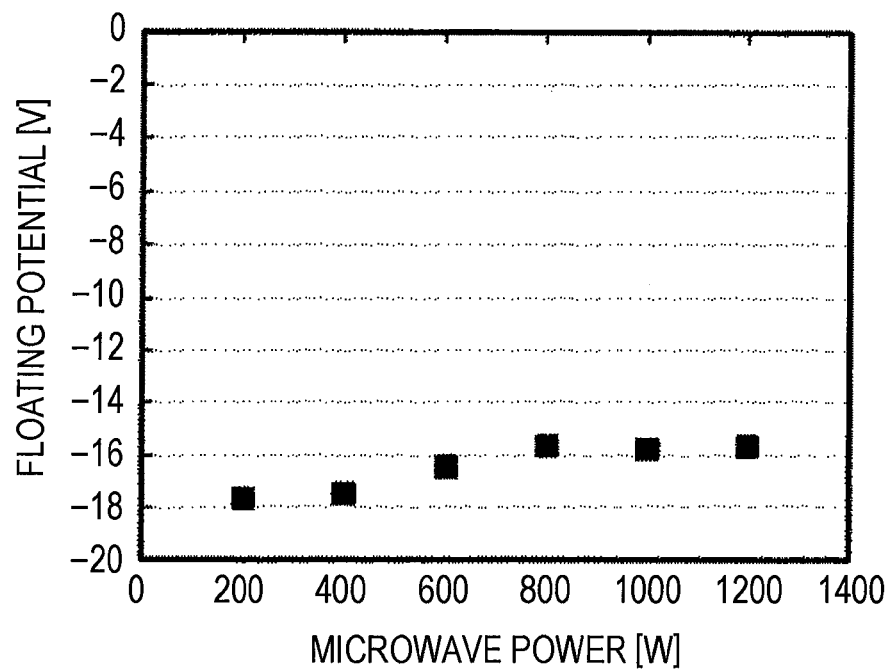
FIG. 8A is a diagram illustrating a microwave incident power dependency of floating potential.
Figure 8B:
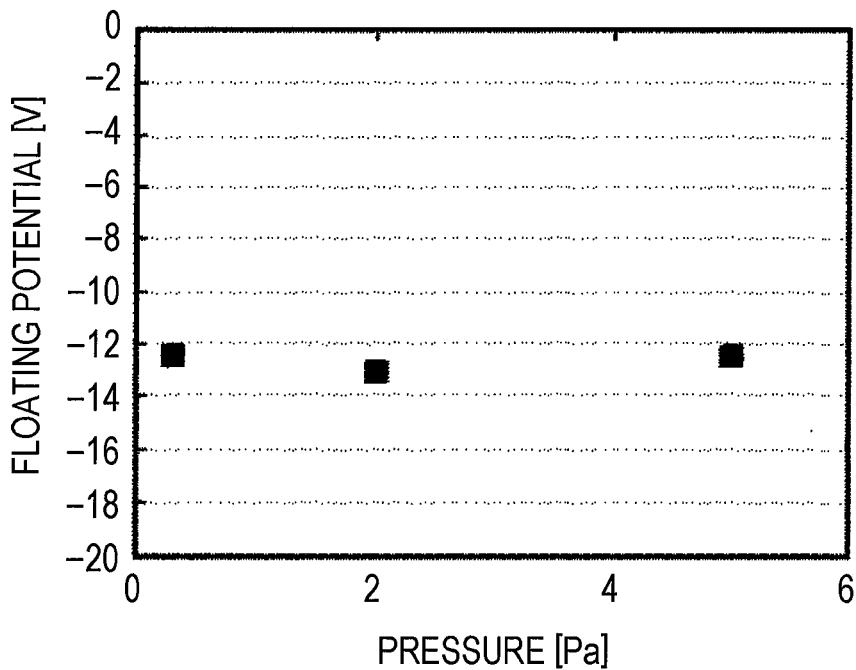
FIG. 8B is a diagram illustrating a processing pressure dependency of the floating potential.

Next, the floating potential of the plasma is described. FIGS. 8A, 8B show a result of the plasma floating potential measured by the inventor. Dependency of the floating potential against the microwave power and pressure in processing is not large, and therefore a change in the floating potential against a change in condition of the plasma processing is relatively low. The average floating potential is around −15 volts, and the value of −15 volts should be corrected as the electric potential of the wafer. It is appropriate that a change in the value is defined as −15 volts±5 volts with consideration of the margin because the floating potential is in a range between −12 volts and −18 volts.

After the push up pin is moved upward, the applied voltage to the electrostatic chuck electrode:the electric potential of the wafer is 1:0.118 as described above, and therefore the voltage to be applied to the electrostatic chuck electrode is in a range of +127 volts±42.4 volts. Accordingly, the voltage V1 applied to the inside and the outside electrostatic chuck electrodes shown in FIG. 4 may be set to, for example +127 volts.

Next, determination of the time T1 with respect to timing for starting the control at the time t1 in FIG. 4 is described. It is required that the plasma discharge is completely finished at the time t1 where the control of the electric potential of the wafer is started. This is because, as described above, if the plasma exists in the processing chamber, the change in the electric potential on the surface of the wafer by the applied voltage to the electrostatic chuck electrode is prevented due to the inflow of electric charge from the plasma. The plasma in the processing chamber is dissipated after the microwave power is interrupted, however it is known that the plasma called afterglow plasma is remained in the processing chamber for a while after the microwave power is interrupted. Accordingly, it is necessary to consider an influence of the afterglow plasma to determine T1.

Figure 9:
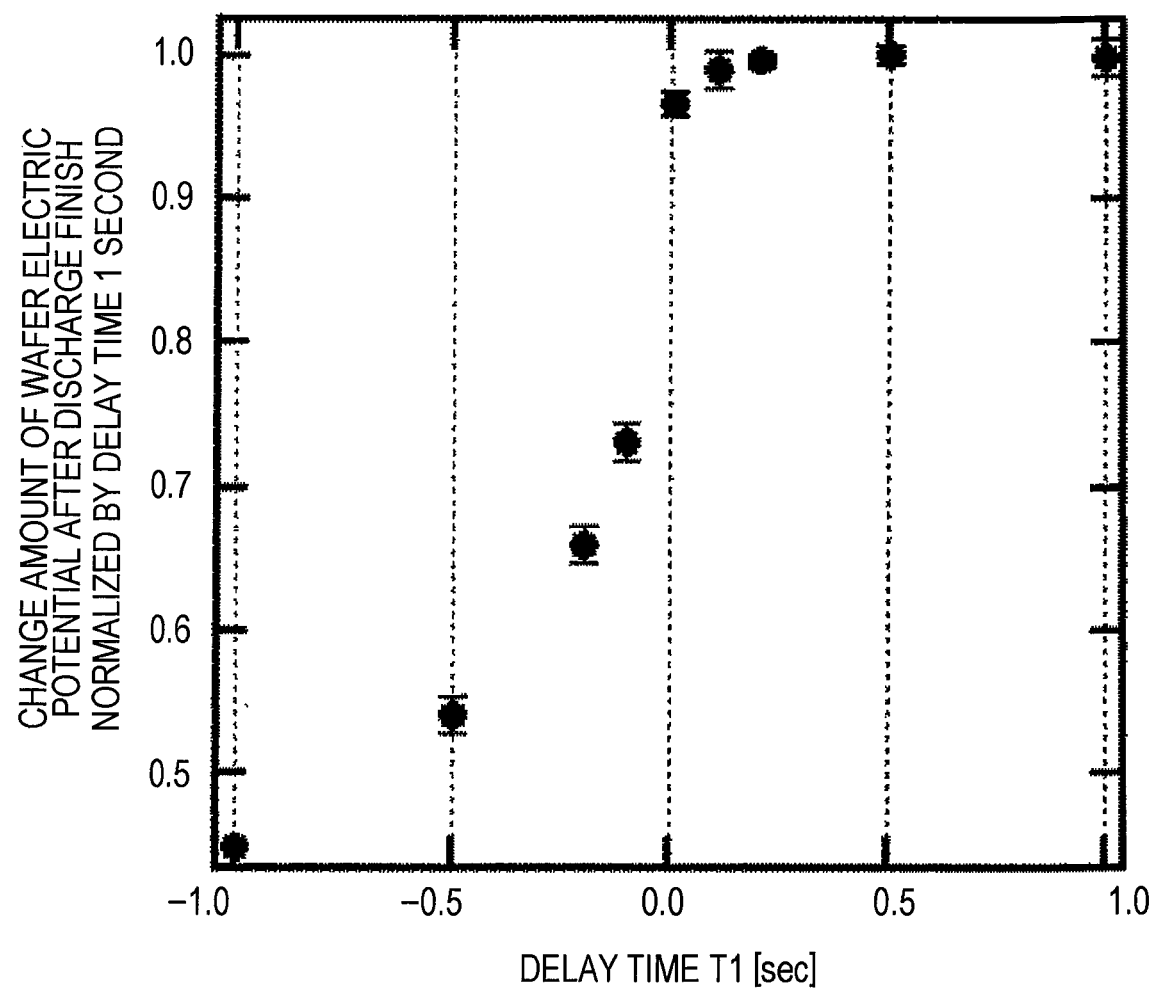
FIG. 9 is a diagram illustrating a relationship between a change amount of an electric potential of the wafer and T1.

A result of an experiment performed by the inventor in determining T1 is shown in FIG. 9. FIG. 9 shows the relationship between a change in the electric potential of the surface of the wafer and T1. It is indicated that when T1 is positive, the application of the output voltage of the variable DC power source is started after the microwave power is interrupted, and when T1 is negative, the application is started before the microwave power is interrupted.

When T1 is negative, the change in the electric potential of the wafer is obviously interrupted, while when T1 is positive, the change in the electric potential of the wafer at T1 of around 0.1 second and the change in the electric potential of the wafer at T1 of 1 second are similar to each other. According to this result, when T1 is more than 0.1 second, the influence of the afterglow plasma is sufficiently prevented. On the other hand, since the foreign substance is attracted to the wafer as T1 becomes longer, longer T1 is not preferable in view of prevention of adhesion of the foreign substance. Since attraction of the foreign substance by the electric potential of the wafer is normally occurred in the unit of seconds, the upper limit of T1 is set to 1 second in the present invention.

By performing a destaticization sequence shown in FIG. 4 by using the control device 116 in accordance with V1 and T1 described above, the electric potential of the wafer becomes 0 volt quickly after the microwave power is interrupted as shown in FIG. 4, and as a result, the attraction of the foreign substance to the wafer can be prevented.

Here, the plasma processing apparatus may have a user interface for freely setting the output voltage of the control described above to the storage device 115 based on operation of a user.

For example, the plasma processing apparatus may have a display, an input device, and software which displays a setting condition, which is input from the input device, on the display and outputs the setting value to the storage device, and therefore the output voltage may be freely set in the storage device 115 for the control according to the present invention when a user manipulates the input device and the display.

Figure 10:
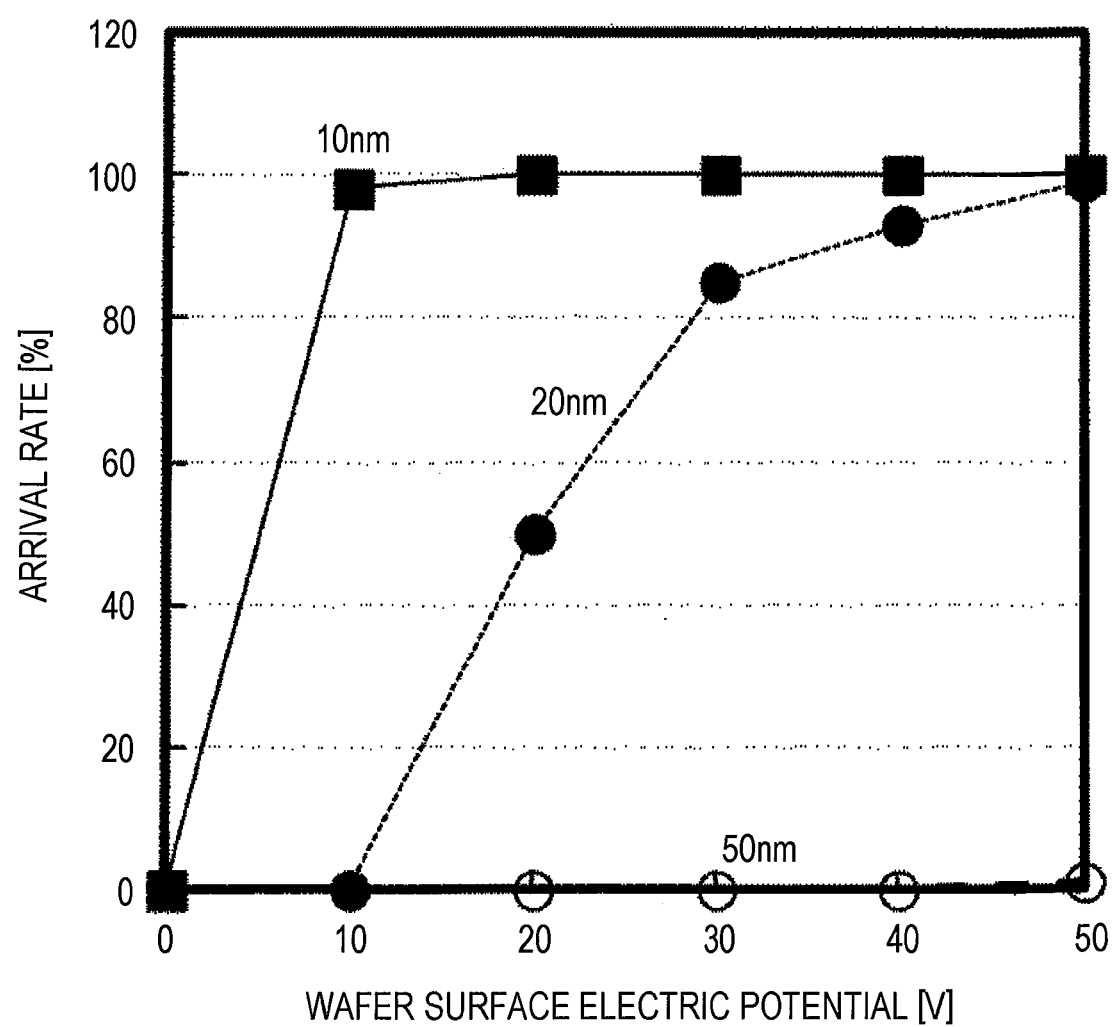
FIG. 10 is a diagram illustrating a wafer surface potential dependency with respect to an arrival ratio of a foreign substance to the wafer.

The foreign substance adhering prevention effect by setting the electric potential of the surface of the wafer to 0 volt after the plasma processing is finished is estimated by a calculation. The result is shown in FIG. 10. A horizontal axis of FIG. 10 denotes the electric potential of the wafer, and a vertical axis denotes an arrival rate of the foreign substance, which is jumped out from an inner wall surface of the processing chamber into the processing chamber, to the wafer. Further, the calculation is performed under the condition described below.

Inner pressure of the processing chamber 101 is 0.6 Pa, and an average flowing speed of rarified fluid in the processing chamber flowed from an upper part of the processing chamber toward an exhaust port is 3 m/s. It is calculated based on three kinds of diameters of the foreign substance of 10 nm, 20 nm, and 50 nm. Electrification of the foreign substance is $-1.6 \times 10^{-19}$ [C]. The arrival rate is obtained by counting a number of the particles, which arrives to the wafer, among 1000 particles in each calculation calculating behavior of the particles.

As these foreign substances are generated in a certain region above the wafer on the inner wall surface of the vacuum processing chamber, each part where the foreign substances are generated is determined at random within the region. Further, an initial speed of each foreign substance from the wall surface is given by a random speed of less than 5 m/s.

As a result of the calculation under the condition described above, it is found that the arrival rate of a large foreign substance of 50 nm to the wafer is not increased under a relatively small electric potential such as the floating potential, while a small foreign substance of 20 nm or 10 nm can be attracted and arrived to the wafer because of wafer electric potential of around floating potential. Especially, almost all of the foreign substances of 10 nm are arrived to the wafer by such a degree of the electric potential of 10 volts, and therefore the present invention makes it possible to prevent the small foreign substance from adhering to the wafer by counteracting the electric potential on the surface of the wafer generated by the plasma when the plasma discharge is stopped.

Example 2

Figure 11:
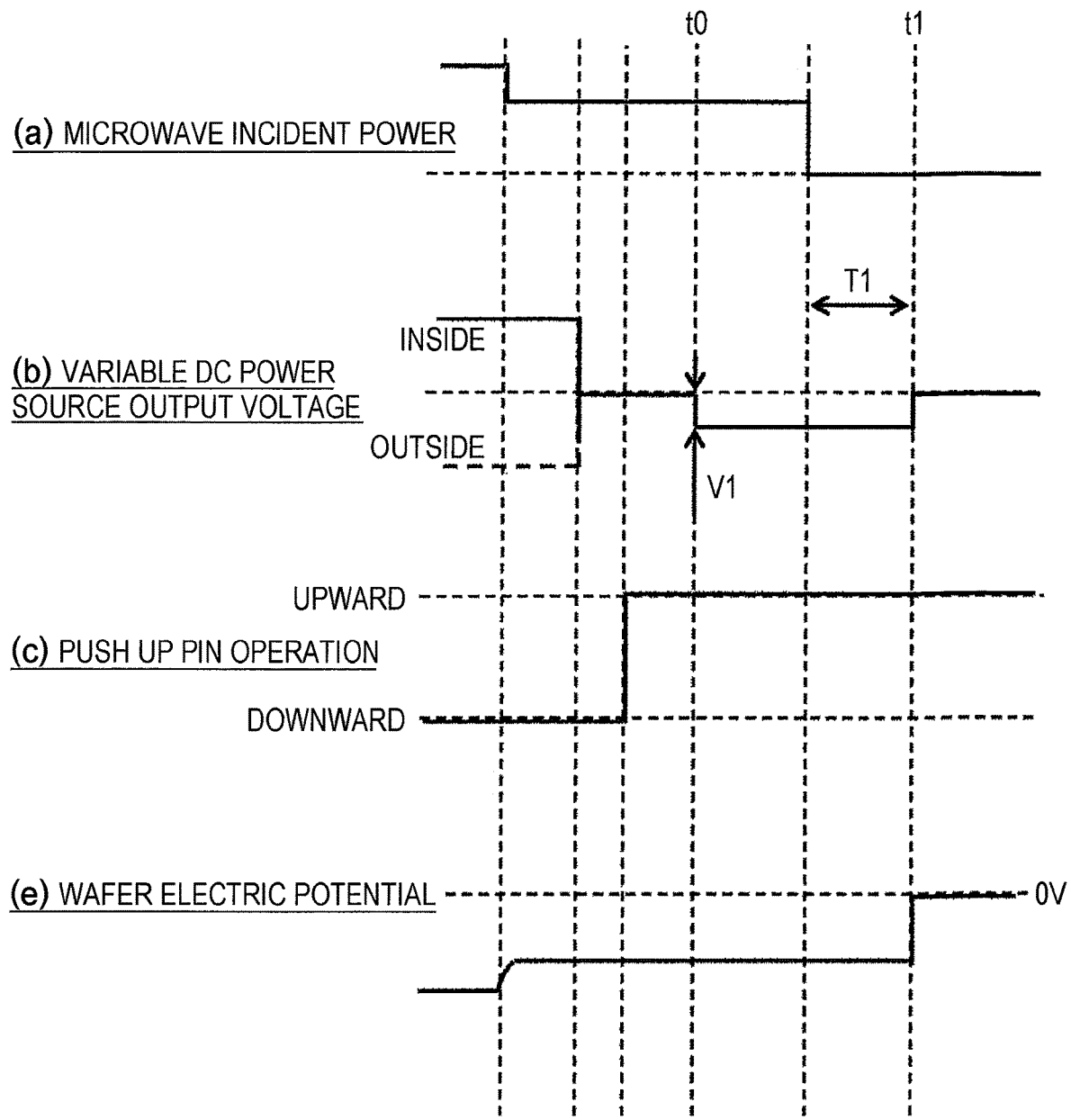
FIG. 11 is a time chart illustrating destaticization processing according to the present invention.

In the present example, a different configuration from that in the example 1 is described. FIG. 11 shows a time chart of processing according to the present example. In the present example, after the push up pin is moved upward, the control device 116 shown in FIG. 1 performs a control which applies a voltage −V1 having a negative polarity to both of the electrostatic chuck electrodes 108, 109 by using the variable DC power sources 110, 111 based on the value stored in the storage device 115 at time t0.

Here, since the absolute value of the applied voltage is similar to that in the example 1, the applied voltage −V1 is for example −127 volts. At this time, the electric potential is applied to the electrostatic chuck electrode, however since the plasma discharge is continued, the electric potential of the wafer is not changed from the plasma floating potential. After that, the microwave power is interrupted while applying the voltage to the electrostatic chuck electrode. And after the microwave power is interrupted, the control device 116 sets the applied voltage to the electrostatic chuck electrode to 0 volt at time t1.

By setting the applied voltage to 0 volt at the time t1, the applied voltage to the electrostatic electrode is changed by +V1 from −V1 to 0, and therefore the electric potential of the wafer is changed in accordance with the change of the electric potential of the electrostatic chuck electrode. A relationship between a change amount of the applied voltage to the electrostatic chuck electrode and a change amount of the electric potential of the wafer is shown in FIG. 6. For example, when the applied voltage of −127 volts is set to 0 volt at the time t1, the applied voltage to the electrostatic chuck electrode is changed by +127 volts, and therefore the electric potential of the wafer is changed by +15 volts and the electric potential, which is such a degree of the plasma floating potential, can be cancelled.

By performing the control described above, the electric potential of the wafer generated by the plasma is cancelled after the plasma discharge is finished, and the adhesion of the charged foreign substance to the wafer can be reduced.

As described above, according to the present invention, as to the plasma processing, the electric potential of the wafer generated by the plasma processing in destaticizing can be cancelled after the plasma discharge is finished, and the adhesion of the charged foreign substance to the wafer can be reduced, and an electric discharge to a structure in the device can be reduced. Further, the present invention is described in detail based on the embodiments, however the present invention is not limited to each embodiment, and various modifications can be adopted within the scope of the present invention.

For example, in the present example, the voltages of the DC power sources applied to the inside and the outside electrostatic chuck electrodes are the same to each other, however the voltages of the DC power sources applied to the inside and the outside electrostatic chuck electrodes may be difference as long as an average of the voltages is to be V1. For example, when the average of the voltages of +127 volts as V1 is applied, the voltage applied to the inside electrode may be +128 volts and the voltage applied to the outside electrode may be +126 volts. However, in such a case in which the voltages applied to the inside and the outside electrode are different, if the resistance of the wafer is high, it is necessary to pay attention to a possibility to lead a difference between the inside and the outside electric potential of the wafer.

Further, for example, it may be possible that a device which monitors the interruption of the output of the microwave power source 105 and controls the output voltage of the variable DC power source by means of the control device 116 based on the value stored in the storage device 115 may be installed, and its function may be installed as software into a main control device (host computer) not shown which controls the whole device.

Further, for example, in the present example, only the operation of the dipole electrode is described, however a monopole electrode may be adopted. Further, for example, a specific resistance of the dielectric film which is arranged on the surface of the electrostatic chuck electrode is not described, however any specific resistance may be adopted regardless of its resistance value. Specifically, an electrode which performs a Coulomb type attraction or an electrode which performs a Johnsen Rahbek type (Johnsen-Rahbek) attraction may be adopted.

Further, the present invention is described by an example to which the ECR type plasma etching device is adopted, however the present invention may be adopted to other plasma source type plasma processing apparatuses such as an inductively-coupled plasma etching device, or a capacitively-coupled plasma etching device.

The invention claimed is:

1. A sample releasing method for releasing a sample subjected to plasma processing in a processing chamber from a sample stage on which the sample is electrostatically attracted by applying a DC voltage by a DC power source to an electrode, the method comprising the steps of:
   moving a pin to an upward position thereby lifting the sample above the sample stage while radio frequency power is provided;
   interrupting the radio frequency power after moving the pin to an upward position;
   while the pin is in the upward position, controlling an output value of the DC power source to apply, after a predetermined time from the interruption of the radio frequency power, a first predetermined voltage to the electrode by changeover from a second predetermined voltage, such that an absolute value of the second predetermined voltage is lower than an absolute value of the first predetermined voltage;
   controlling a conveyance mechanism to convey the sample outside the processing chamber while controlling the output value of the DC power source to apply the first predetermined voltage to the electrode;
   after the sample is conveyed outside the chamber by the conveyance mechanism, controlling the output value of the DC power source to apply the second predetermined voltage.

* * * * *